United States Patent [19]

Takatori

[11] Patent Number: 5,359,565
[45] Date of Patent: Oct. 25, 1994

[54] OPTICAL MEMORY

[75] Inventor: Sunao Takatori, Tokyo, Japan

[73] Assignee: Yozan Inc., Tokyo, Japan

[21] Appl. No.: 865,273

[22] Filed: Apr. 8, 1992

[30] Foreign Application Priority Data

Apr. 12, 1991 [JP] Japan ................. 3-108783

[51] Int. Cl.$^5$ .................. G11C 11/42; G11C 13/04
[52] U.S. Cl. .................... 365/105; 365/117
[58] Field of Search ............. 365/108, 109, 112, 117; 250/214 LS; 359/56, 84, 72

[56] References Cited

U.S. PATENT DOCUMENTS

| | | | |
|---|---|---|---|
| 3,681,765 | 8/1972 | Chapman | 365/109 X |
| 3,747,075 | 7/1973 | Keneman et al. | 365/112 X |
| 4,041,477 | 8/1977 | Drenckhan | 365/109 X |
| 4,622,654 | 11/1986 | Yaniv et al. | 365/108 |
| 4,904,057 | 2/1990 | Sakayori et al. | 365/56 X |
| 4,984,198 | 1/1991 | Kobayashi et al. | 365/117 X |
| 5,055,662 | 10/1991 | Hasegawa | 365/108 X |

FOREIGN PATENT DOCUMENTS

| | | |
|---|---|---|
| 0235748 | 9/1987 | European Pat. Off. |
| 0352814 | 1/1990 | European Pat. Off. |
| 0385329 | 9/1990 | European Pat. Off. |
| 0402944 | 12/1990 | European Pat. Off. |
| 0437238 | 7/1991 | European Pat. Off. |
| 2261576 | 6/1973 | Fed. Rep. of Germany |
| 59-216126 | 12/1984 | Japan ........... 359/72 |
| 1018130 | 1/1989 | Japan ........... 359/72 |
| 2181263 | 4/1987 | United Kingdom |
| 2205173 | 11/1988 | United Kingdom |

OTHER PUBLICATIONS

Patent Abstracts of Japan, vol. 15, No. 162, Apr. 1991, Unexamined Applications, p. 80 P1194, Kokai-No. 3-29 926 (Seiko).
Patent Abstracts of Japan, vol. 13, No. 172, Apr. 1989, Unexamined Applications, p. 74 P862, Kokai-No. 1-7 022 (Idemisu Kosan).
Patent Abstracts of Japan, vol. 15, No. 140, Apr. 9, 1991, Unexamined Applications, p. 116 P1189 Kokai-No. 3-20 719 (Seiko).
Patent Abstracts of Japan, vol. 12, No. 114, Apr. 12, 1988, Unexamined Applications P. 688, 2961, Kokai-No. 62-242919 (Seiko).
W. L. et al., "Hydrogenated Amorphous–Silicon Photosensor for Optically Addressed High-Speed Spatial Light Modulator" IEEE Transactions on Electron Devices-vol. 36-No. 12-Dec. 1989-pp. 2959-2964.
Takahashi et al. "High-speed light valve using an amorphous silicon photosensor and ferroelectric liquid crystals" Apply. Phys. Letter 51 (16)-Oct. 1987-pp. 1233-1235.

*Primary Examiner*—Eugene R. LaRoche
*Assistant Examiner*—Son Dinh
*Attorney, Agent, or Firm*—Cushman, Darby & Cushman

[57] ABSTRACT

An optical memory which allows for the high-speed random access of two-dimensional information. Portions of a light receiver made from material with photovoltaic or photoconductive effect are connected to corresponding portions of a ferroelectric liquid crystal panel through an amplifier layer. To write, a light image is shown on the light receiver. When light striking each portion of the light receiver is sufficiently strong, the state of the corresponding part of the liquid crystal panel is changed. The state of the panel can be read with an image scanner for scanning the liquid crystal panel.

3 Claims, 2 Drawing Sheets

OPTICAL MEMORY

BACKGROUND OF THE INVENTION

1. Field of the Invention

The present invention relates to an optical memory, especially to an optical memory which can be read from and written to.

2. Background Information

Conventionally, an optical disk is a device for recording information as an optical signal. A magneto-optical disk is presently thought to be the best way to make an optical disk which can be read from and written onto. An industry standard relating to it has now been prepared. (Nikkei Electronics, 91-2-4, p. 75)

The reading and writing of information on an optical disk is done sequentially because the information is put in sequence on a magnetic head. The access time for such disk is twenty or thirty milliseconds, which is approximately a thousand times more than the access time for an IC memory. Because the access speed of an optical disk is extremely slow, such disks are generally inappropriate for performing random access of two-dimensional information.

SUMMARY OF THE INVENTION

The present invention solves such conventional problems and provides an optical memory that can read and write at high speed.

In the present invention, the optical memory stores the optical information in the state of a liquid crystal by using a liquid crystal drive either with photovoltaic effect or that using switching with photoconductive effect. Both embodiments make use of the bi-stable characteristic of dielectric liquid crystals. The memory is cleared in the subject optical memory all at once by supplying an electric field of reverse direction to the dielectric liquid crystal.

In the optical-memory according to the present invention, the writing time is equal to the sum of the time for electrical addressing and for changing the state of the liquid crystal, and the reading time is equal to the time for taking out the state of the liquid crystal as the surface information.

PREFERRED EMBODIMENTS OF THE PRESENT INVENTION

Hereinafter, the first embodiment of the optical memory according to the present invention is described with reference to the attached drawings.

Figure 1:
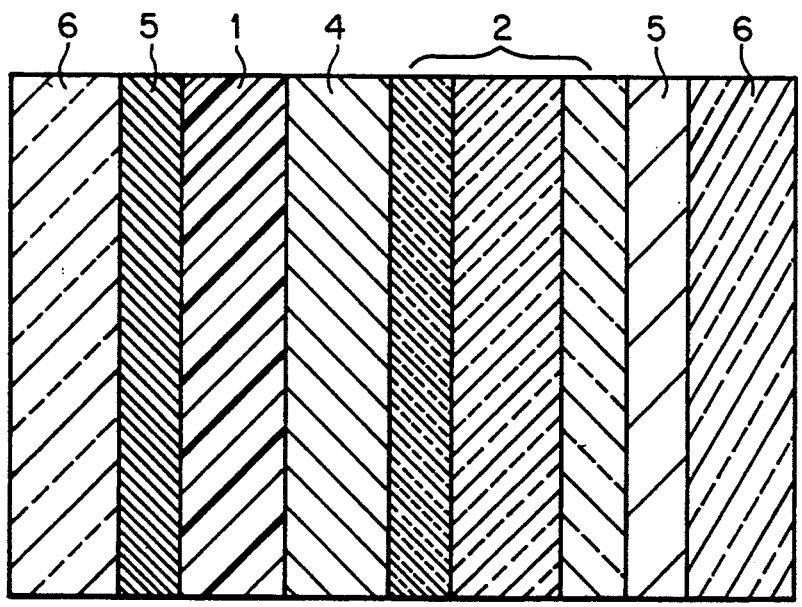
FIG. 1 shows a cross section of an optical memory that uses a thin film with photovoltaic effect.

In FIG. 1, the optical memory comprises, for example, thin film 1 of a-SiH (a light receiving means with photovoltaic effect), amplifier layer 4, ferroelectric liquid crystal panel 2, electrodes 5, and glass plates 6.

Figure 2:
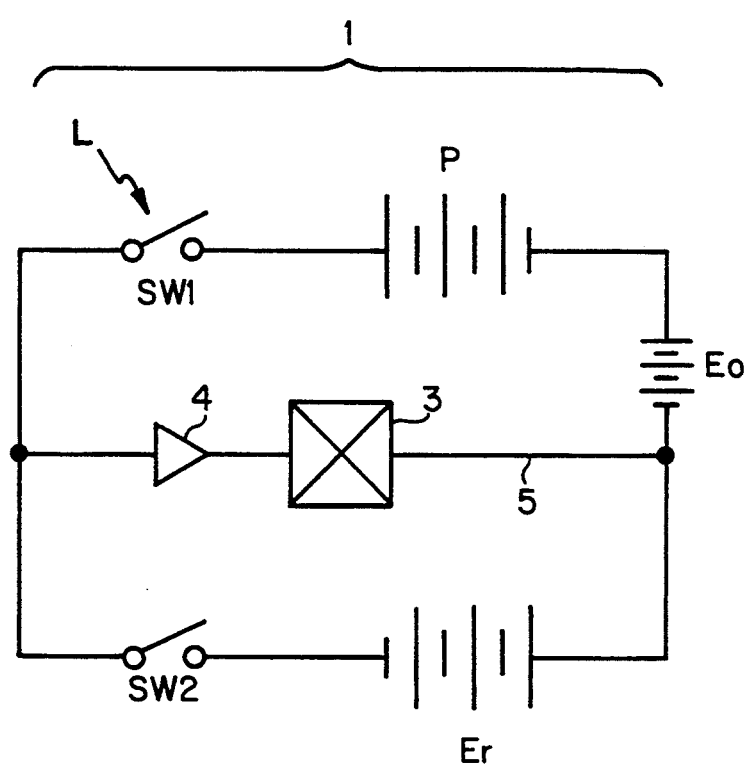
FIG. 2 shows a circuit which represents the effective electrical connection between the liquid crystal panel and thin film in the embodiment of FIG. 1.

FIG. 2 shows a circuit which represents the effective electrical connection of one cell or pixel of the optical memory including part 3 of liquid crystal panel 2, amplifier layer 4 and thin film 1 of the first embodiment. Electrodes 5 of FIG. 1 are disposed on opposite sides of for part portion P, with portion P being the part of thin film 1 corresponding to the same pixel as part 3. That is, portion P has a dimension corresponding to the size of one pixel to be processed. In FIG. 2, the generation of electromotive force by light is represented by switch SW1 and portion P of thin film 1. That is, portion P of thin film 1 generates electromotive force by light incidence L. Thin film 1 generates power when exposed to light and portion P generates power for part 3 of crystal panel 2.

The voltage generated in portion P of thin film 1 is amplified in amplifier layer 4. The output of amplifier 4 is applied to part 3 of liquid crystal panel 2.

Lucent electrodes 5 are adhered on both sides of the structure comprised of thin film 1, amplifier layer 4, and liquid crystal panel 2. The amount of light on portion P of thin film 1 that is sufficient to cause the state of part 3 of panel 2 to change can be controlled by bias voltage Eo. Voltage Eo is used to create an electric field across liquid crystal panel 2. The bias voltage is controlled according to the light that is input. The entire optical memory is protected by covering it with glass plates 6 on both of its sides.

In order to write on the optical memory, two-dimensional optical information such as an image is inputted to thin film 1. Consequently, the power generated in portion P (the section of thin film 1 corresponding to pixel) which has received optical energy is amplified in amplifier layer 4. If the light energy is strong enough, portion P will generate an electromotive force sufficient to change the state of part 3 of liquid crystal panel 2, in conjunction with bias voltage Eo.

It is possible to read optically the state of part 3 as the two-dimensional image from the opposite side of thin film 1. An image scanner can be used as the tool for reading. In this way, the optical memory makes it possible to directly write and read the two-dimensional optical information. The necessary time for writing is equal to only the time it takes for the state of liquid crystal part 3 to change. The time necessary for such a change of state can be expected to be from 100 to 999 microseconds in a mass produced cell.

Before new information can be written in an optical memory in which information has already been stored, it is necessary to clear the memory. In order to allow for the clearing of the memory, reverse-biased power source and switch SW2 are connected to lucent electrode 5. All parts of liquid crystal panel 2 are restored to the initial state at the same time by closing switch SW2.

Figure 3:
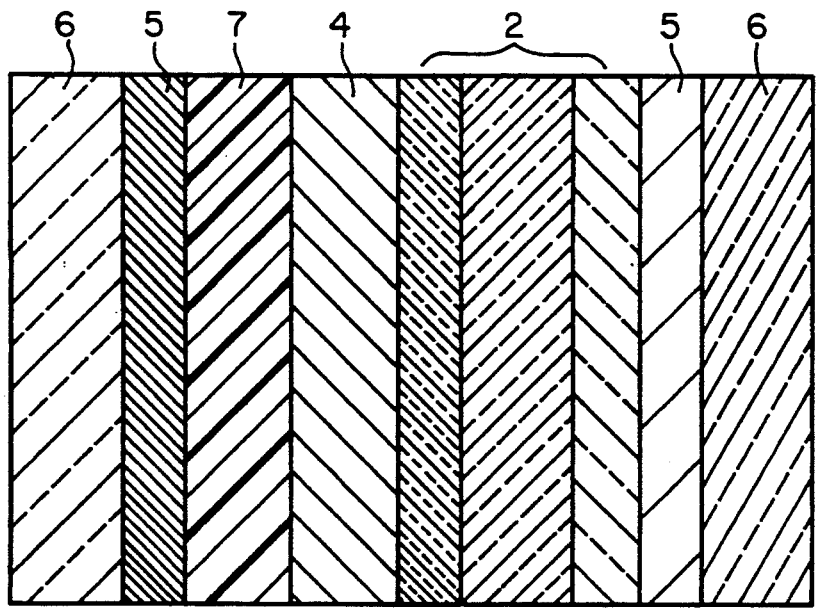
FIG. 3 shows a cross section of an optical memory that uses a thin film with photoconductive effect.

FIG. 3 shows a cross-section of an optical memory according to the second embodiment. In the second embodiment, thin film 7, having photoconductive effect, is used instead of a thin film 1, having photovoltaic effect.

Figure 4:
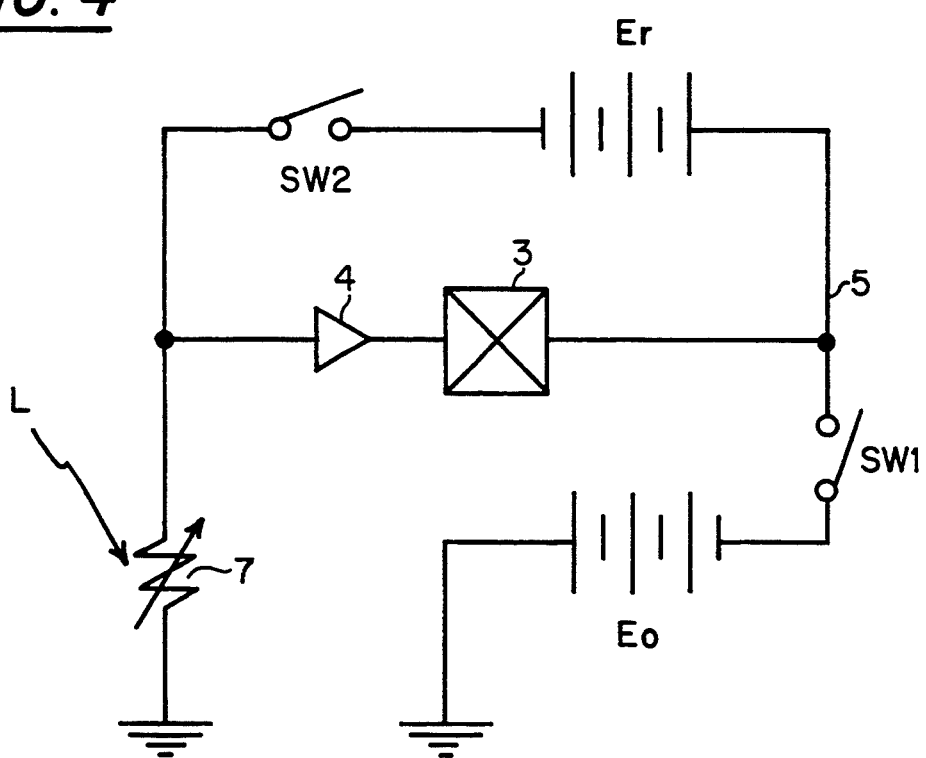
FIG. 4 shows a circuit which represents the effective electrical connection between the liquid crystal panel and thin film in the embodiment of FIG. 3.

In FIG. 4, thin film 7 is shown as a variable resistor in a circuit which represents the cross-section shown in FIG. 3. The state of part 3 of the liquid crystal panel 2 changes because of the increase of electromotive force across part 3 generated by bias voltage Eo when the resistance of thin film 7 decreases. This is caused by a photoconductive effect, and because of the power amplification of amplifier layer 4. The reverse electromotive force generated by power source Er is used for clearing the memory when switch SW2 is closed, as was discussed with reference to the first embodiment.

As mentioned above, the present invention allows for the performance of high speed random storage and access of two dimensional information stored in the memory, where such access includes both the reading and writing of the information.

What is claimed is:

1. An optical memory comprising: light receiving means made from a material having a photovoltaic effect, said light receiving means being divided into a plurality of minute areas corresponding to image pixels to be processed, and wherein each minute area generates a voltage in relation to light each area receives;
   a ferroelectric liquid crystal panel having a plurality of liquid crystal parts;
   an amplifier layer which is disposed between said light receiving means and said ferroelectric liquid crystal panel, said amplifier layer being divided into a plurality of amplifying area, each said amplifying area corresponding to one of said minute areas for amplifying said voltage generated by said corresponding minute area and for creating an amplified first electric field in a corresponding one of said liquid crystal parts;
   electrode means for impressing second electric field in a direction which is opposite to a direction of said first electric fields, upon each of said liquid crystal parts; and
   a switch selectively causing said electrode means to impress said second electric field upon each of said liquid crystal parts.

2. An optical memory comprising:
   light receiving means made from a photoconductive material, said light receiving means being divided into a plurality of minute areas corresponding to image pixels to be processed, and wherein each minute area generates a corresponding variable resistance in relation to light each minute area receives;
   a ferroelectric liquid crystal panel having a plurality of liquid crystal parts;
   electrode means for impressing at least one of a first electric field upon each of said liquid crystal parts and a second electric field, in a direction which is opposite to a direction of said first electric field, upon each of said liquid crystal parts;
   an amplifier layer which is disposed between said light receiving means and said ferroelectric liquid crystal panel, said amplifier layer being divided into a plurality of amplifying areas, each said amplifying area amplifies a voltage related to said variable resistance to cause said electrode means to impress said first electric field upon each of said liquid crystal parts;
   a first switch for selectively said first electric field to be applied upon each of said liquid crystal parts: and
   a second switch for selectively causing said second electric field to be applied upon each of said liquid crystal parts.

3. An optical memory comprising:
   light receiving means made from a material having a photovoltaic effect, said light receiving means being divided into a plurality of minute areas corresponding to image pixels to be processed, and wherein each minute area generates a voltage in relation to light each area receives;
   a ferroelectric liquid crystal panel having a plurality of liquid crystal parts;
   an amplifier layer which is disposed between said light receiving means and said ferroelectric liquid crystal panel, said amplifier layer being divided into a plurality of amplifying areas, each said amplifying area corresponding to one of said minute areas for amplifying said voltage generated by said corresponding minute area and for creating an amplified first electric field in a corresponding one of said parts;
   electrode means for impressing, upon each of said liquid crystal parts, at least one of a bias electric field in a direction which is the same as a direction of said first electric fields and a second electric field in a direction which is opposite to said direction of said first electric fields, wherein the bias electric field is created by applying a bias voltage across the electrode means; and
   a switch selectively causing said electrode means to impress said second electric field upon each of said liquid crystal parts.

* * * * *